US011281514B2

(12) United States Patent
Colombo

(10) Patent No.: US 11,281,514 B2
(45) Date of Patent: Mar. 22, 2022

(54) PROCESSING SYSTEM, RELATED INTEGRATED CIRCUIT, DEVICE AND METHOD

(71) Applicant: STMicroelectronics Application GmbH, Aschheim-Dornach (DE)

(72) Inventor: Roberto Colombo, Munich (DE)

(73) Assignee: STMICROELECTRONICS APPLICATION GMBH, Aschheim-Dornach (DE)

(*) Notice: Subject to any disclaimer, the term of this patent is extended or adjusted under 35 U.S.C. 154(b) by 180 days.

(21) Appl. No.: 16/693,103

(22) Filed: Nov. 22, 2019

(65) Prior Publication Data

US 2020/0167220 A1 May 28, 2020

(30) Foreign Application Priority Data

Nov. 27, 2018 (IT) .......................... 102018000010603

(51) Int. Cl.
*G06F 13/42* (2006.01)
*G06F 11/07* (2006.01)
(Continued)

(52) U.S. Cl.
CPC ............ *G06F 11/0757* (2013.01); *G06F 1/10* (2013.01); *G06F 11/0706* (2013.01); *G06F 11/0739* (2013.01); *G06F 1/12* (2013.01)

(58) Field of Classification Search
CPC .... G06F 11/0757; G06F 1/10; G06F 11/0706; G06F 11/0739
(Continued)

(56) References Cited

U.S. PATENT DOCUMENTS 4,646,312 A * 2/1987 Goldsbury ............ H03M 13/19
714/54
5,684,841 A * 11/1997 Chiba ................... H04L 7/0337
327/141
(Continued)

FOREIGN PATENT DOCUMENTS

DE 102016108666 A1 11/2016
DE 102016124524 A1 11/2017

OTHER PUBLICATIONS

Wikipedia, "System Time," https://en.wikipedia.org/w/index.php?title=System_time&oldid=845459080, Jun. 11, 2018, pp. 1-10.
(Continued)

*Primary Examiner* — Volvick Derose
(74) *Attorney, Agent, or Firm* — Slater Matsil, LLP

(57) ABSTRACT

A processing system includes a timer circuit and a processing circuit. The timer circuit is configured to generate a system time signal. The processing circuit is configured to receive the system time signal, detect whether the system time signal reaches or exceeds a given reference value, and start execution of a given processing operation in response to the detection. The timer circuit has associated an error code calculation circuit configured to compute a first set of error detection bits as a function of bits of the system time signal. The processing circuit has an associated error detection circuit configured to: compute a second set of error detection bits as a function of the bits of the system time signal received, compare the first set of error detection bits with the second set of error detection bits, and generate an error signal in response to the comparison.

20 Claims, 4 Drawing Sheets

(51) Int. Cl.
*G06F 1/10* (2006.01)
*G06F 1/12* (2006.01)

(58) Field of Classification Search
USPC .......................................................... 713/400
See application file for complete search history.

(56) References Cited

U.S. PATENT DOCUMENTS

| | | | | |
|---|---|---|---|---|
| 2001/0014922 | A1* | 8/2001 | Kuge | G06F 13/1689 710/36 |
| 2003/0204792 | A1* | 10/2003 | Cahill | G06F 11/0757 714/55 |
| 2004/0122607 | A1* | 6/2004 | Fishman | H04B 10/07 702/69 |
| 2006/0282592 | A1* | 12/2006 | Zakriti | G06F 12/0669 710/300 |
| 2012/0087402 | A1* | 4/2012 | Patoine | H04L 69/28 375/226 |
| 2013/0297974 | A1* | 11/2013 | Milks | G06F 11/26 714/30 |
| 2014/0173361 | A1* | 6/2014 | Meaney | G06F 11/221 714/47.2 |
| 2016/0335149 | A1* | 11/2016 | David | G06F 11/0706 |
| 2019/0146034 | A1 | 5/2019 | D'Angelo | |
| 2019/0272210 | A1 | 9/2019 | Colombo | |

OTHER PUBLICATIONS

Wikipedia, "Error Detection and Correction," https://en.wikipedia.org/w/index.pho?title=Error_detection_and_correction&oldid=869995606, Nov. 21, 2018, pp. 1-9.

* cited by examiner

PROCESSING SYSTEM, RELATED INTEGRATED CIRCUIT, DEVICE AND METHOD

CROSS-REFERENCE TO RELATED APPLICATIONS

This application claims priority to Italian Patent Application No. 102018000010603, filed on Nov. 27, 2018, which application is hereby incorporated herein by reference.

TECHNICAL FIELD

Embodiments of the present disclosure relate generally to an electronic device and method, and, in particular embodiments, to a processing system, related integrated circuit, device and method.

BACKGROUND

FIG. 1 shows a typical electronic system, such as the electronic system of a motor vehicle, comprising a plurality of processing systems 10, such as embedded systems or integrated circuits, e.g., a Field Programmable Gate Array (FPGA), Digital Signal Processor (DSP) or a micro-controller (e.g., dedicated to the automotive market).

For example, in FIG. 1 are shown three processing systems $10_1$, $10_2$ and $10_3$ connected through a suitable communication system 20. For example, the communication system may include a vehicle control bus, such as a Controller Area Network (CAN) bus, and possibly a multimedia bus, such as a Media Oriented Systems Transport (MOST) bus, connected to vehicle control bus via a gateway. Typically, the processing systems 10 are located at different positions of the vehicle and may include, e.g., an Engine Control Unit (ECU), a Transmission Control Unit (TCU), an Anti-lock Braking System (ABS), a body control modules (BCM), and/or a navigation and/or multimedia audio system.

Future generations of processing systems, in particular micro-controllers dedicated to automotive applications, will exhibit a significant increase in complexity, mainly due to the increasing number of functionalities (such as new protocols, new features, etc.) and to the tight constraints concerning the operation conditions of the system (such as lower power consumption, increased calculation power and speed, etc.).

FIG. 2 shows a block diagram of an exemplary digital processing system 10, such as a micro-controller, which may be used as any of the processing systems 10 of FIG. 1.

In the example considered, the processing system 10 comprises at least one processing unit 102, such as a microprocessor, usually the Central Processing Unit (CPU), programmed via software instructions. Usually, the software executed by the processing unit 102 is stored in a program memory 104, such as a non-volatile memory, such as a Flash memory or EEPROM. Generally, the memory 104 may be integrated with the processing unit 102 in a single integrated circuit, or the memory 104 may be in the form of a separate integrated circuit and connected to the processing unit 102, e.g., via the traces of a printed circuit board (PCB). Thus, in general the memory 104 contains the firmware for the processing unit 102, wherein the term firmware includes both the software of a micro-processor and the programming data of a programmable logic circuit, such as a FPGA.

In the example considered, the processing unit 102 may have associated one or more resources 106 selected from the group of:

one or more communication interfaces IF, e.g., for exchanging data via the communication system 20, such as a Universal asynchronous receiver/transmitter (UART), Serial Peripheral Interface Bus (SPI), Inter-Integrated Circuit ($I^2C$), Controller Area Network (CAN) bus, and/or Ethernet interface, and/or a debug interface; and/or one or more analog-to-digital converters AD and/or digital-to-analog converters DA; and/or one or more dedicated digital components DC, such as hardware timers and/or counters, or a cryptographic co-processor; and/or one or more analog components AC, such as comparators, sensors, such as a temperature sensor, etc.; and/or one or more mixed signal components MSC, such as a PWM (Pulse-Width Modulation) driver.

Accordingly, the digital processing system 10 may support different functionalities. For example, the behavior of the processing unit 102 is determined by the firmware stored in the memory 104a, e.g., the software instructions to be executed by a microprocessor 102 of a micro-controller 10. Thus, by installing a different firmware, the same hardware (micro-controller) can be used for different applications.

As mentioned before, the processing systems 10 may control different operations of the vehicle, where the processing systems 10 may be located at different positions in the vehicle and each processing system 10 may implement one or more functions/operations. Many of these functions/operations may be "hard real-time," i.e., they need to respect very precise timed operations. For example, the engine control is subject to thermodynamic laws that should be balanced with the real-time state of the vehicle. Typically, the real time state of the vehicle is monitored via sensors, which may be connected directly to the processing system 10 implementing the Engine Control Unit (ECU) or to other processing systems 10 of the vehicle. Similarly, in order to control/command the operation the motor, the Engine Control Unit (ECU) has to control/command one or more actuators, e.g., in order to inject the fuel, open a valve for gas discharge etc., which may be connected directly to the processing system 10 implementing the Engine Control Unit (ECU) or to other processing systems 10 of the vehicle.

Thus, in many applications, the execution of a first operation within a processing system 10 has to be synchronized with the execution of a second operation within the same processing system 10 or within a further processing system 10. Generally, the so-called "timing" can be either referred to an absolute time or can be relative to a given signal/parameter, such as the car speed, which may request to run some actions quicker or slower depending on the current vehicle speed.

For example, such operations running in modern cars are regulated by the AUTOSAR consortium specification. As described in the AUTOSAR specification, an arbitrary number of runnable application services should be executed synchronously. In this context, synchronous means that they shall start with a well-defined and guaranteed relative offset (e.g., a relative offset "0," means that the execution shall occur at the same point in time). Accordingly, in this way the sensor data read out or actuator actuation may be synchronously triggered by one or more of the processing systems. For example, the AUTOSAR specification lists the following exemplary services that shall be correlated to a precise time-base:

Sensor data fusion: Data from various sensor systems like radar or stereo multi-purpose cameras can be temporally correlated.

Event data recording: In some cases, e.g., in an incident/crash, it is desirable to store data about the events and the internal state of different processing systems 10, e.g., ECUs.

Access to a synchronized calendar time for diagnostic events storage.

For a temporal correlation of these events and states a common time base is thus required. For example, the conventional approach to this request consists in implementing some time reference within each processing systems 10 configured to execute synchronized operations, wherein the time reference circuit provides a global system time for the respective processing system 10. For example, this internal time reference circuit may be implemented with a timer circuit or a real-time-clock.

Generally, the operation of the circuits of the various processing systems 10 may also be synchronized, e.g., a master processing system 10 may provide its own time reference to the other processing systems 10.

SUMMARY

Some embodiments related to processing systems, such as micro-controllers, having associated a memory in which configuration data are stored.

Various embodiments generate a time reference within a processing system and distribute this time reference to one or more circuits of the processing system.

Some embodiments relate to a processing system. Some embodiments concern a related integrated circuit, device and method.

In some embodiments, the processing system, such as a micro-processor, comprises a timer circuit and a processing circuit.

In various embodiments, the timer circuit is configured to generate, in response to a clock signal, a system time signal comprising a plurality of bits indicative of a time tick-count. For example, in various embodiments, the timer circuit comprises a digital counter configured to generate a count value in response to the clock signal. A digital comparator is configured to generate a comparison signal by comparing the count value with a reference value and an accumulator is configured to increase the system time signal in response to the comparison signal.

Specifically, in various embodiments, the system time signal is then transmitted to the processing circuit, e.g., via a separate parallel time bus. Accordingly, the processing circuit is configured to receive the system time signal from the timer circuit. Next, the processing circuit may detect whether the system time signal reaches or exceeds a given reference value and start execution of a given processing operation when the detection indicates that the system time signal has reached or has exceeded the given reference value. For example, in various embodiments, the processing circuit comprises a digital and/or analog processing circuit, such as a microprocessor, an A/D or D/A converter, etc. A digital comparator is configured to generate an interrupt signal for the digital and/or analog processing circuit by comparing the system time signal with a reference value indicative of a scheduled event time. In various embodiments, the reference value is stored in a register, which may be programmable by a microprocessor of the processing system. In various embodiments, an adder may be used to automatically increase the second reference value by a given amount in response to the interrupt signal, thereby setting a new event time.

In various embodiments, the timer circuit has associated an error code calculation circuit and the processing circuit has associated an error detection circuit, i.e., the error code calculation circuit operates on the system time signal to be transmitted to the processing circuit and the error detection circuit operates on the system time signal received by the processing circuit. Thus, in various embodiments, the distance between the error code calculation circuit and the timer circuit is smaller than the distance between the error code calculation circuit and the processing circuit. Similarly, the distance between the error detection circuit and the processing circuit is smaller than the distance between the error detection circuit and the timer circuit.

In various embodiments, the error code calculation circuit is configured to compute a first set of error detection bits as a function of the bits of the system time signal (to be transmitted). The bits of the system time signal and the error detection bits are then transmitted to the processing circuit. Accordingly, the error detection circuit may compute a second set of error detection bits as a function of the bits of the system time signal received by the processing circuit, compare the first set of error detection bits with the second set of error detection bits, and generate an error signal when the comparison indicates the first set of error detection bits does not correspond to the second set of error detection bits. Generally, the error code calculation circuit may compute the first set of error detection bits by using an error correction code and the error detection circuit may correct single bit errors of the system time signal and generate the error signal only when the system time signal has more than two bit errors.

Generally, the error detection circuit may be implemented with two redundant error detection circuits. Similarly, in various embodiments, a second error detection circuit may be associated with the timer circuit, i.e., the second error detection circuit operates on the system time signal to be transmitted to the processing circuit. Accordingly, the distance between the second error detection circuit and the timer circuit is smaller than the distance between the second error detection circuit and the processing circuit. The second error detection circuit may compute a third set of error detection bits as a function of the bits of the system time signal (to be transmitted), compare the first set of error detection bits (generated by the error code calculation circuit) with the third set of error detection bits and generate an error signal when the comparison indicates the first set of error detection bits does not correspond to the third set of error detection bits.

In various embodiments, the processing system may also monitor the evolution of the system time signal and/or the clock signal.

For example, in various embodiments, the processing system comprises a trigger generator configured to generate a trigger signal comprising a trigger when the system time signal increases by a given amount. In this case, a watchdog timer may generate an error signal when the time between two consecutive triggers in the trigger signal is greater than a given maximum time. Additionally or alternatively, a timer circuit may be used to generate an error signal when the time between two consecutive triggers in the trigger signal is not between a lower threshold and an upper threshold.

Conversely, in order to monitor the clock signal, the processing system may comprise an analog clock monitor circuit configured to generate an error signal when the clock signal remains at low or high for a given maximum time.

BRIEF DESCRIPTION OF THE DRAWINGS

Embodiments of the present disclosure will now be described with reference to the annexed drawings, which are provided purely by way of non-limiting example and in which.

DETAILED DESCRIPTION OF ILLUSTRATIVE EMBODIMENTS

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
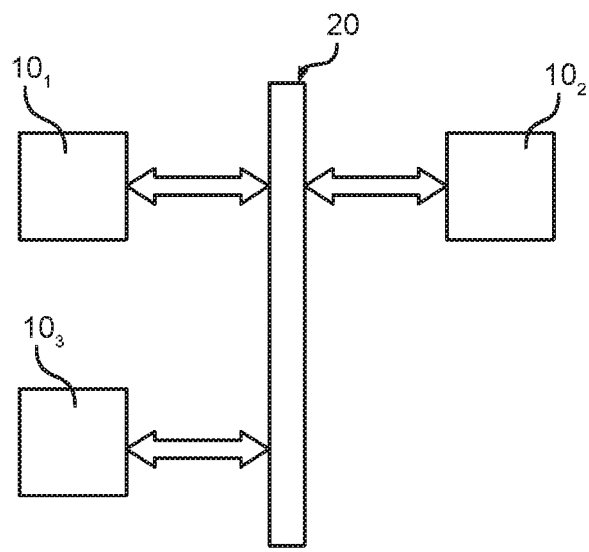
FIG. 1 shows a typical electronic system.
Figure 2:
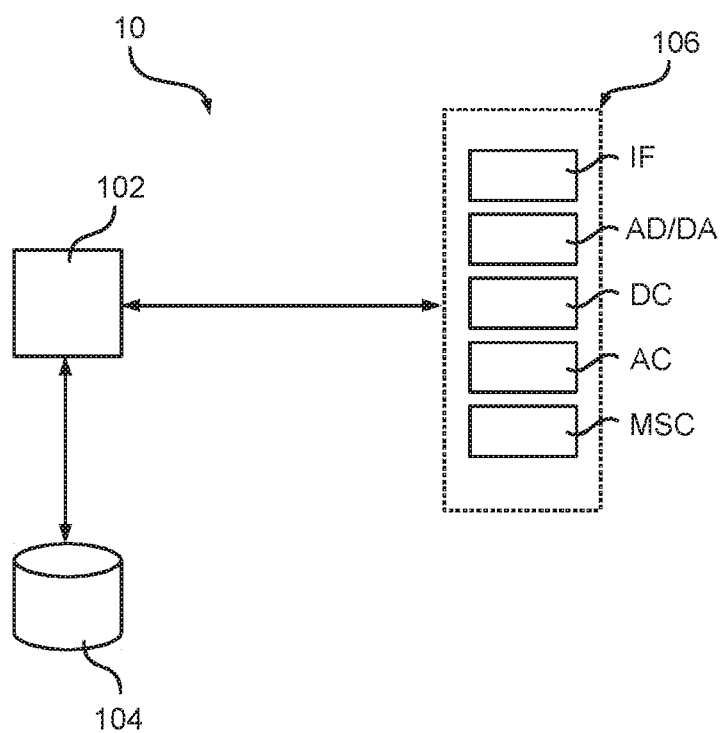
FIG. 2 shows a typical processing system of the electronic system of FIG. 1.

In the following FIGS. 3 to 7, parts, elements or components which have already been described with reference to FIGS. 1 and 2 are denoted by the same references previously used in such Figures. The description of such previously described elements will not be repeated in the following in order not to overburden the present detailed description.

Figure 3:
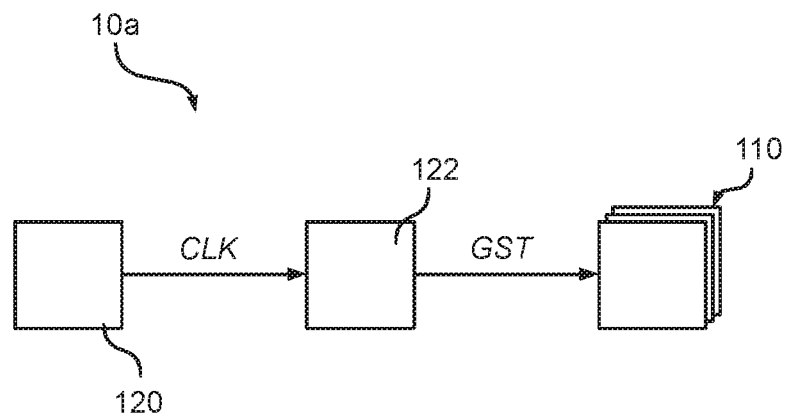
FIG. 3 shows an embodiment of a processing system comprising a timer circuit configured to generate a system time signal and a processing circuit configured to use the system time signal in order to start given processing operations.

FIG. 3 shows an embodiment of a processing system 10*a*, in accordance with the present description.

In the embodiment considered, the processing system 10*a* comprises a time reference circuit 122 configured to generate a time reference signal GST, which is provided to at least one circuit 110. Generally, the circuit 110 may be any circuit of the processing 10*a* requiring a reference time. For example, reference can be made to the description of the processing system 10 shown in FIG. 2. For example, the circuit 110 may be a processing unit 102 or one of the resources 106 shown in FIG. 2, such as an analog to digital converter AD configured to start an analog-to-digital conversion as a function of the signal GST. Preferably, the time reference circuit 122 and the circuit(s) 110 are integrated in the same integrated circuit.

Specifically, in the embodiment considered, the time reference circuit 122 is configured to generate the signal GST in response to a clock signal CLK provided by an oscillator circuit 120. Generally, the oscillator circuit 120 may be integrated in the integrated circuit of the processing system 10*a* or may be at least in part connected to a pin of the integrated circuit of the processing system 10*a*. For example, in various embodiments, the oscillator circuit 120 may be implemented with an external reference oscillator and an internal phase-locked loop (PLL).

Thus, generally, the time reference circuit 122 receives at an input a clock signal CLK and generates the time reference signal GST. Specifically, in various embodiments, the time reference signal GST is not a mere binary trigger signal but corresponds to a data signal having a plurality of bits, wherein the value of the time reference signal GST represents a system time. For example, the time reference signal GST may have 32 or 64 bits. Generally, the time reference signal GST may be provided to the circuit(s) 110 via any suitable communication system, including both parallel and at least in part serial communications. For example, in various embodiments, the signal GST may be transmitted to the block(s) 110 on a bus of the processing systems 10*a*. Generally, this bus may be the system bus, e.g., used to connect the resources 106 to the processing system 102, or a dedicated time-base bus. For example, in various embodiments, a parallel communication is used, wherein each bit of the signal GST is provided to the circuit(s) 110 via a respective line/trace in the integrated circuit.

Specifically, in various embodiments, the circuit 122 is configured to increase the time reference signal GST in response to the clock signal CLK, such that the time reference signal GST corresponds to the number of "ticks" that have transpired since a given starting date, usually called epoch. Generally, the epoch may be a fixed date, e.g., 1 Jan. 1970 00:00:00 UT similar to the Unix system time or 1 Jan. 1601 00:00:00 UT similar to a Windows based system time, or variable, e.g., from the switch on of the vehicle. For example, reference can be made to the webpage https://en.wikipedia.org/wiki/System_time for possible encoding schemes of a system time, which may also be applied to the time reference signal GST.

Accordingly, from a circuit point of view, each tick determined as a function of the clock signal CLK corresponds to a given period/time, such as 100 ns or 1 ms, and the (count) value of the signal GST may be used to trigger given operation within the circuits 110. Moreover, by synchronizing the value of the signal GST between plural processing systems 10*a* (e.g., by using an interface IF shown in FIG. 2 and the communication system 20 shown in FIG. 1) and by using the same time resolution for the ticks in the various processing systems 10*a*, the operation of these processing systems 10*a* may be synchronized.

Figure 4:
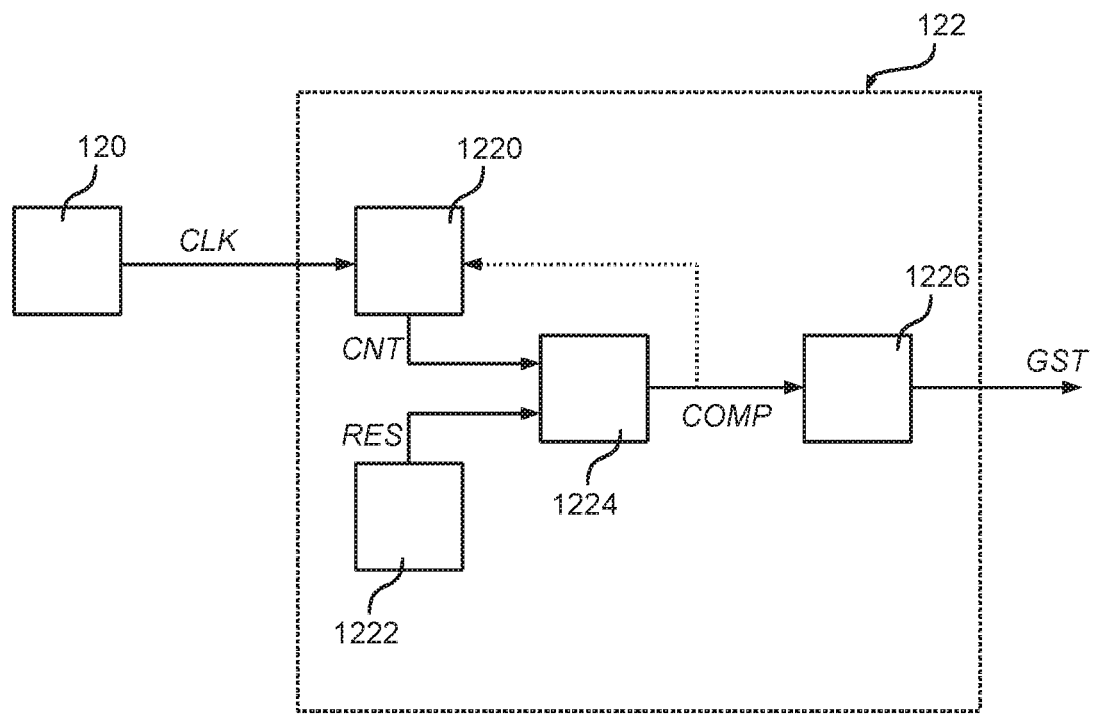
FIG. 4 shows an embodiment of the timer circuit of FIG. 3.

A possible implementation of the time reference circuit 122 is shown in FIG. 4.

Specifically, in the embodiment considered, the signal GST is stored in an accumulator 1226, e.g., implemented with a register and a digital adder. Moreover, in the embodiment considered, the clock signal CLK having a given frequency is provided to a digital counter 1220 configured to increase a count value CNT in response to each rising and/or falling edge of the clock signal CLK. Specifically, in the embodiment considered, the count value CNT and a resolution signal RES are provided to a digital comparator 1224, e.g., implemented with a combinational logic circuit, which generates at output a comparison signal COMP indicating whether the count value CNT corresponds to the resolution signal RES. The signal COMP is provided at input to the accumulator 1226. Specifically, the accumulator 1226 is configured to increase the value of the signal GST when the comparison signal COMP indicates that the count value CNT corresponds to the resolution signal RES. In various embodiments the comparison signal COMP may also be used to reset the counter 1220, thereby starting a new count cycle.

Accordingly, in various embodiments, the circuit 122 may be configured to increase the counter 1220 at each clock cycle of the clock signal CLK, whereby the comparison signal COMP corresponds to a clock signal with lower frequency as specified by the resolution signal RES. Specifically, the signal COMP represents the "tick" used to increase via the accumulator 1226 the signal GST, i.e., the system time. Accordingly, the signal RES may be used to specify the time resolution of the tick used to increase the system time GST. Generally, the signal RES may be hard-wired or may be stored in a programmable register 1222. For example, a programmable register 1222 may be used in order to compensate variations of the frequency of the clock signal CLK, e.g., resulting from production tolerances and/or temperature variations of the oscillator circuit 120.

Figure 5:
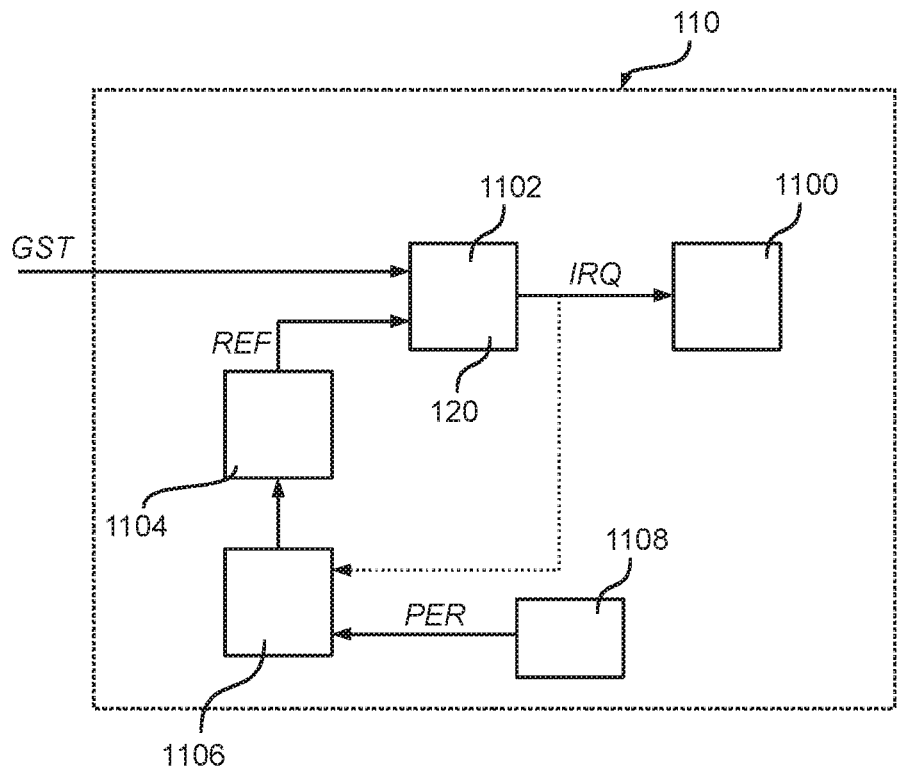
FIG. 5 shows an embodiment of the processing circuit of FIG. 3.

FIG. 5 shows in this respect a possible implementation of the activation of the operation within a block 110. Generally, the block 110 comprises a processing circuit 1100, such as, e.g., the processing unit 102. Thus, the processing circuit 1100 could execute given operation by periodically reading the signal GST and comparing the time information read with a scheduled event time. In case of a software programmable microprocessor 102, the event scheduler could be implemented via software instructions.

Conversely, FIG. 5 shows an embodiment wherein the processing circuit 1100 has associated a hardware digital comparator circuit 1102, e.g., implementation with a combinational logic circuit, configured to generate an interrupt signal IRQ when the signal GST corresponds to and/or is greater than a given reference value REF.

In the embodiment considered, the reference signal REF is stored in a programmable register 1104. Thus, by programming the register 1104, e.g., via the processing unit 102, the next event time may be scheduled when the comparison circuit 1102 generates the interrupt signal IRQ, thereby activating the processing of the scheduled operation within the processing circuit 1100.

In various embodiments, the interrupt signal IRQ may also be used to increase the value REF stored in the register 1104. For example, in the embodiment considered, the register 1104 may be written by a digital adder 1106, which also receives at an input a period value PER. Specifically, the adder 1106 is configured to, when the interrupt signal IRQ is set, store the sum of the signals REF and PER to the register 1104, thereby setting the next event. Generally, the value PER may be fixed (e.g., hardwired), provided by a programmable register 1108 (e.g., programmable via the processing unit 102) or variable (e.g., provided by a sensor, such as a sensor configured to detect the velocity of the vehicle). For example, in this way, the processing unit 102 may set the time of a first event by programming the vale REF in the register 1104 and may set the period PER between the following events by setting the content of the register 1108.

Generally, each processing circuit 1100, such as the processing unit 102, may have associated also a plurality of comparator circuits 1102 and respective registers 1104 configured to generate respective interrupts IRQ, wherein each interrupt IRQ may activate a respective function/operation within the processing circuit 1100.

Thus, the embodiments shown in FIGS. 3 to 5 permit to implement a central module 122 (within the processing system 10a) configured to provide data GST specifying a relative time information, thus permitting also to evaluate the passage of time. Thus, some embodiments may be used to synchronize the operations executed by a plurality of blocks no/processing circuits 1100 within the same processing system 10a.

Moreover, in various embodiments, the processing system 10a may also be configured to set the value of the signal GST stored in the accumulator GST to a given value. For example, this value may be received via one of the communication interfaces IF of the processing system 10a. For example, in this way, the signal GST may be aligned with an absolute reference time, thereby implementing an absolute real-time clock.

Moreover, in various embodiments, the value to be stored to the accumulator 1226 may also be received from another processing system 10a, which permits to synchronize the value of the signal GST between a plurality of processing systems 10a. Thus, in this case, the operation executed by a first block 110 of a first processing system 10a may be synchronized with the operation executed by a second block 110 of a second processing system 10a, insofar as the blocks 110 use signals GST having the same values.

However, the inventor has observed, that automotive applications are often requested to handle also possible malfunctions of the processing system 10a, as specified, e.g., by the ISO 26262 specification. Thus, insofar as the signal GST is used to trigger the execution of one or more functions/operations of a processing system 10a, these functions/operations may not operate correctly when the signal GST is not correct, e.g., due to an incorrect operation the circuits 120 and/or 122 and/or the communication system used to transmit the signal GST to the circuit(s) 110, thereby possibly influencing the safety and/or security of the vehicle. Thus, the need is felt for solutions able to ensure the availability, correctness, and integrity of the time-base value GST in order to generate a precise and reliable time tick.

As mentioned before, the embodiments shown in FIGS. 3 and 4 generate a signal GST, whose value is indicative of the system time. For example, in various embodiments, a 64-bit time base value may be generated. Specifically, as mentioned before, the signal GST is increased at each system tick determined as a function of the clock signal CLK, e.g., each time the counter value CNT matches the resolution signal RES. Moreover, the signal GST is provided to one or more circuits 110 of the processing system 10a, such as the processing unit 102, e.g., the CPU of a micro-controller. Specifically, in various embodiments, each circuit 110 may be configured to generate a hardware interrupt IRQ based on a programmable reference value REF and optionally a programmable period value PER.

In this respect, the inventor has observed that in order to render the generation of the interrupt IRQ compliant with the requests of availability, correctness, and integrity, the processing system 10a should be able to:

detect a malfunction during the generation of the time-base value GST;

verify the correct distribution of the time-base value GST within the processing system 10a; and optionally detect malfunction during the generation of the interrupt IRQ used to schedule given operations.

Figure 6:
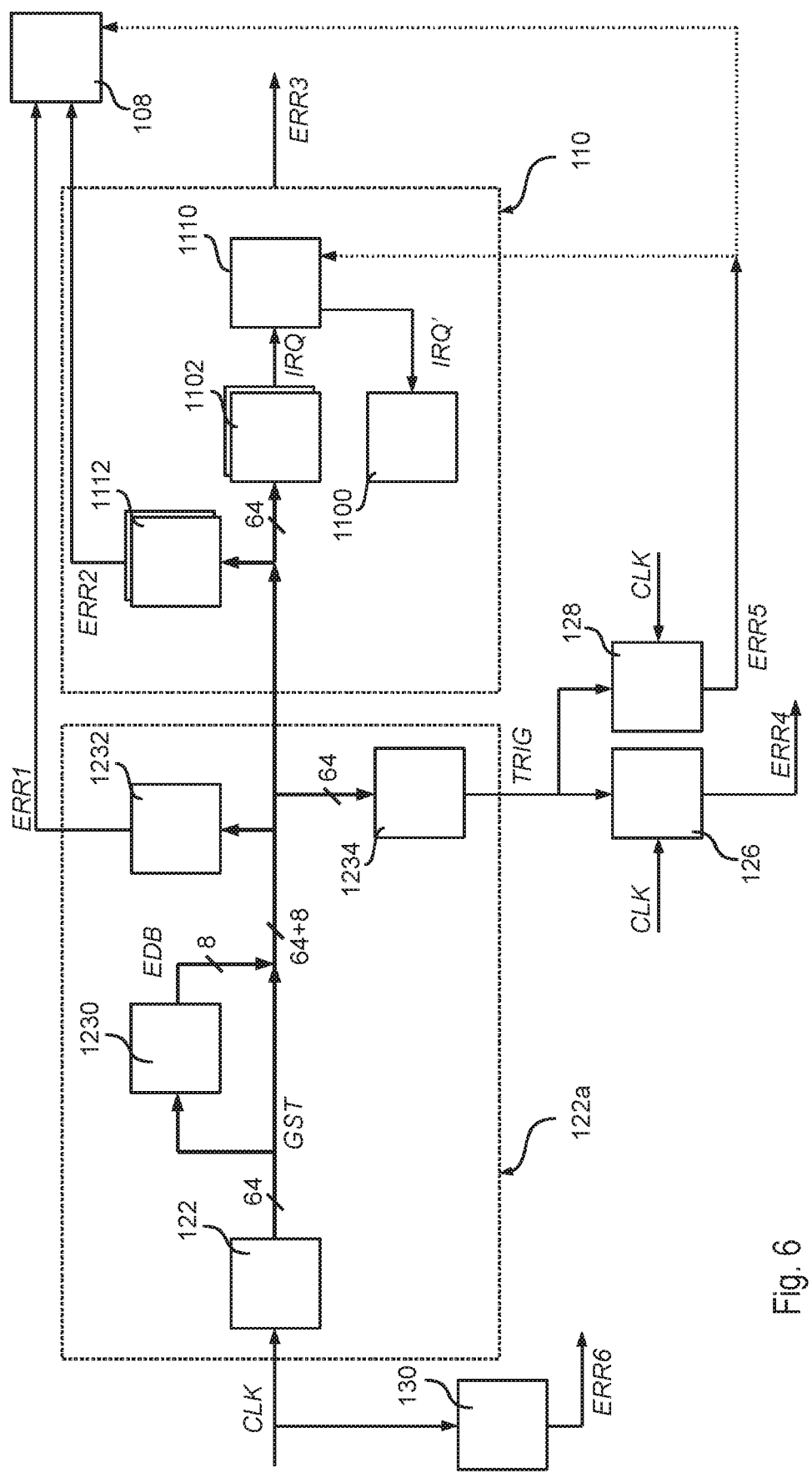
FIG. 6 shows an embodiment of a modified processing system able to detect one or more malfunctions of the timer circuit and/or the transmission of the system time signal.

FIG. 6 shows a modified processing system 10a which has a similar basic architecture of the processing system 10a described with respect to FIG. 3. Accordingly, also in this case, the processing system 10a comprises a time reference/system time generator circuit 122 configured to generate a system time signal GST and at least one circuit 110 executing at least one operation as a function of the system time signal GST. For possible embodiments of the circuits 122 and 110, reference can be made to the description of FIGS. 4 and 5.

In the embodiment considered, the system time generator circuit 122 has associate an Error Correction Code (ECC) generation circuit 1230 configured to receive at an input the signal GST and generate a signal EDB comprising one or more error detection and/or correction bits, such as parity bits, which are generated as a function of the bit values of the signal GST. For a description of possible error detection and/or correction codes adapted to be used for the generation of the bits EDB, reference can be made e.g., to Wikipedia's page "*Error detection and correction*" available at "https://en.wikipedia.org/wiki/Error_detection_and_correction."

In various embodiments, the ECC circuit 1230 is integrated in the circuit 122, which is schematically shown by the box 122a in FIG. 6. Specifically, in this case, the circuit 1230 is located in the vicinity of the other circuits of the system time generator circuit 122 (in particular the accumulator 1226), i.e., the physical distance between the circuit 1230 and the accumulator 1226 (e.g., in a monolithic silicon substrate) is significantly smaller than the physical distance between the circuit 1230 and each of the block(s) 110.

In various embodiments, the signal EDB is then provided together with the signal GST to the circuit(s) 110. For example, in various embodiments, the signal GST may have 64 bits and the signal EDB may have 8 bits.

In various embodiments, the ECC generation circuit 1230 may have associated a further ECC generation circuit 1232. Specifically, the further ECC generation circuit 1232 is configured to recalculate the error detection and/or correction bits as a function of the bit values of the signal GST, compare the recalculated error detection and/or correction bits with the signal EDB and generate an error signal ERR1 when the recalculated error detection and/or correction bits do not correspond to the signal EDB. Substantially, the circuit 1232 represents a redundant ECC generation circuit able to detect a fault in the circuit 1230 during the generation of the data EDB. In various embodiments, both the circuit 1230 and the circuit 1232 execute the respective operations each time the signal GST changes.

Generally, the signal ERR1 could be provided directly to the processing unit 102. Conversely, in the embodiment considered, the error signal ERR1 is provided to an error collection circuit 108. For example, reference can be made to Italian patent application 102018000003234 for a possible implementation of the error collection circuit 108.

In addition to or as alternative to the circuit 1232, one or more of the circuits 110 may have associated a respective ECC generation circuit 1112. Accordingly, in the embodiment considered, each circuit 1112 is configured to recalculate the error detection and/or correction bits as a function of the bit values of the signal GST, compare the recalculated error detection and/or correction bits with the signal EDB and generate an error signal ERR2 when the recalculated error detection and/or correction bits do not correspond to the signal EDB. Similar to the error signal ERR1, the error signal ERR2 may be fed directly to the processing unit 102 and/or the error collection circuit 108.

Specifically, while the circuit 1232 (when used) is located in the vicinity of the circuit 1230 and used to verify the correct operation of the circuit 1230, each circuit 1112 is located in the vicinity of a respective circuit 110, in particular the comparator 1102, and used to verify the correct operation of the communication system used to transmit the signal GST and EDB. Generally, not each block 110 receiving the signal GST may also comprise a circuit 1112. However, preferably all circuits 110 configured to execute event-based operations possibly affecting the safety of the vehicle have associated a respective circuit 1112.

In various embodiments, the error bits EDB may not be used only for error detection, but the error bits EDB may also permit an error correction of one or more bit errors of the signal GST. For example, the circuit 1112 may be configured to correct up to two incorrect bits, wherein no error is generated for a single bit-error and an error is generated for a double bit-error.

Once the correctness of the signal GST has been verified and optionally minor errors (e.g., single-bit errors) have been corrected by the circuit 1112, the circuit 1102 may compare the signal GST with the reference signal REF and generate an interrupt IRQ when the signals match (see also FIG. 4).

In various embodiments, also the interrupt generation circuit (circuit 1102 and the optional blocks 1104, 1106, 1108) may be redundant in order to detect an incorrect operation. For example, as schematically shown in FIG. 6, the circuit 110 may generate an error signal ERR3 when the outputs of the two redundant circuits 1102 do not match. Similar to the other error signals, also the error signal ERR3 may be fed directly to the processing unit 102 and/or the error collection circuit 108.

Thus, the ECC circuits 1230, 1232 and 1112 permit to verify the correct transmission of the system time signal GST within the processing unit 10a. Specifically, the ECC logic detects and (e.g., in case of single-bit error) prevents alteration of the bus value, and the duplication of certain logic circuits guarantees the proper functionalities of the circuits. Moreover, by reporting eventual malfunctions to a fault collector circuit 108, a proper error management, as requested by ISO 2626 specification, may be handled.

However, the inventor has observed that these circuits are unable to verify whether the system time signal GST evolves also correctly insofar as only the instantaneous values of the signals GST/EDB are verified. Specifically, the ECC circuits are unable to detect the following errors:

the system time GST is not refreshed at all,
the system time GST is refreshed with an incorrect time tick (signal COMP shown in FIG. 4), and
the system time GST is refreshed with the correct time tick but the value is wrong.

In order to detect the first problem, the processing system 10a comprises a further trigger generator circuit 1234. Specifically, in various embodiments, the trigger generator circuit 1234 is configured to monitor the system time signal GST and periodically generate a trigger signal TRIG when the system time GST increases by a given amount.

For example, in various embodiments, the trigger generator circuit 1234 may have the architecture of the interrupt generator circuit described with respect to FIG. 5, wherein:

a first circuit (1102) compares the system time signal GST with a reference value (REF) and generates the trigger signal TRIG when the signal GST is equal to or greater than the reference value;

a register (1104) provides the reference value (REF); and an adder (1106) increases the reference value by a given amount (PER) when the trigger signal TRIG is generated.

Thus, when the circuit 122 is operating correctly, the trigger signal TRIG is periodically set.

Generally, instead of using an adder circuit, the circuit 1234 may also compare the system time GST with a reference value, and when the signal GST is greater than the reference value, the circuit 1234:

generates the trigger signal TRIG; and stores the current system time GST as new reference value.

Thus, in this case, the trigger signal TRIG would be set, each time the value of the signal GST increases.

In various embodiments, the processing system 10*a* may thus comprise a watchdog timer 126 that is restarted in response to the trigger signal TRIG, i.e., the watchdog timer 126 is configured to determine whether the trigger signal TRIG is set before a given maximum time lapses. Watchdog timers are per se well known in the art, thus rendering a more detailed description herein superfluous. Substantially, a watchdog timer is a digital hardware counter, which is increased in response to a clock signal, e.g., the signal CLK, and an error signal ERR4 is generated when a given maximum value is reached. Thus, when the watchdog timer 126 is reset in response to the trigger signal TRIG, the watchdog timer 126 generates the error signal ERR4 when the system time GST does not change anymore or the value of the system time does not evolve correctly because, in this case, the trigger generator circuit 1234 will not trigger the signal TRIG before the maximum value is reached. For example, assuming that the system tick (signal COMP) should be set/fired every 1 ms, and the circuit 1234 is configured to detect any increase of the system time GST, the watchdog timer could be configured to set the error signal ERR4 after, e.g., 1.1 ms. Similar to the other error signals. Also the error signal ERR4 may be fed directly to the processing unit 102 and/or the error collection circuit 108.

Thus, the watchdog timer 126 is able to monitor whether the system time GST increases within a given maximum time. However, the circuit 126 is unable to determine whether the tick time is correct, i.e., whether the period of the refreshing of the signal GST is correct.

Accordingly, in addition to or as alternative to the watchdog timer 126, the processing system 10*a* may comprise a digital timer 128. Specifically, in various embodiments, the timer 128 is configured to measure the period between two consecutive pulses in the trigger signal TRIG. For example, in various embodiments, the timer 128 may be implemented with a digital counter, which is increased in response to a clock signal, such as the clock signal CLK. Specifically, when the trigger signal TRIG is set, the timer circuit 128 stores the count value of the timer 128 to a register and resets the count value. Thus, the circuit 128 may compare the count value stored to the register with a lower and an upper threshold and set an error signal ERR5 when the count value stored to the register of the timer circuit 128 is smaller than the lower threshold or greater than the upper threshold. Similar to the other error signals, also the error signal ERR5 may be fed directly to the processing unit 102 and/or the error collection circuit 108. Generally, the count value stored in the register of the timer/counter 128 may also be provided to the processing unit 102, which may perform a corresponding comparison operation via software instructions.

As mentioned before, the error signals may be fed to the processing circuit 102 and/or the error collection circuit 108. This is schematically shown for the error signal ERR5. For example, in the embodiment considered, the interrupt signal IRQ for the processing unit 102, exemplified by the processing circuit 1100, is provided together with the interrupt signal IRQ to a combinational logic circuit 1110, such as an OR gate, which generates a modified interrupt signal IRQ' for the processing unit 102. The interrupt IRQ' for the processing unit $10_2$ may be generated either when the signal IRQ is generated by the timer circuit 1102 or when a given error signal (e.g., ERR5) is set.

Thus, the circuits 126 and/or 128 permit to monitor the correct evolution of the system time GST. However, these circuits require also a clock signal. Thus, in order to render the operation of the circuits 126 and 128 independent from the operation of the circuit 122, the circuit 122 may use a first clock signal and the circuits 126 and/or 128 may use a second (independent) clock signal.

Additionally or alternatively, the processing system 10*a* may comprise an analog clock monitor unit 130. Specifically, the circuit 130 is configured to monitor the clock signal CLK used to generate the system time signal GST and generate an error signal ERR6 when the clock signal does not change for a given period of time.

Figure 7:
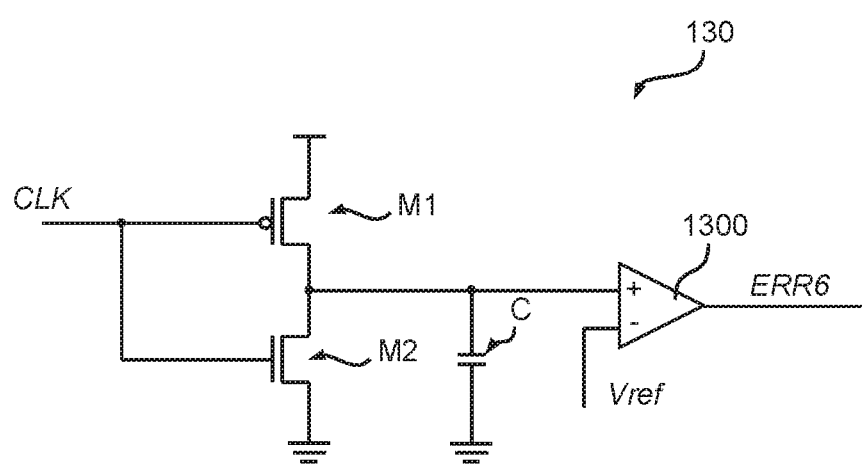
FIG. 7 shows details of the processing system of FIG. 6.

For example, FIG. 7 shows an embodiment of an analog clock monitor circuit 130 configured to determine whether the signal CLK remains at zero. In the embodiment considered, the clock signal CLK is provided to an input of an inverter stage. For example, in the embodiment considered, the inverter stage is implemented with two transistors, such as a p-channel Field Effect Transistor (FET) M1 and a n-channel FET M2, connected in series between a supply voltage, such as the supply voltage VDD of the digital circuits of the processing system 10*a*, and ground. Specifically, in the embodiment considered, the clock signal CLK is applied to the gate terminal of the transistors M1/M2. The output of the inverter stage, e.g., the intermediate point between the two transistors M1 and M2, is connected via a capacitor C to ground.

Accordingly, when the clock signal CLK is low, the capacitor C is charged though the supply voltage via the switch-on resistance of the transistor M1. Conversely, when the clock signal CLK is high, the capacitor C is discharged via the switch-on resistance of the transistor M2 to ground. Preferably, the transistor M1 has a greater switch-on resistance than the transistor M2.

Thus, when the oscillator is stopped and the clock signal CLK remains low, the voltage at the capacitor C increases. Thus, the circuit 130 may comprise an analog comparator 1300 configured to set the error signal ERR6 when the voltage at the capacitor C exceeds a given threshold value Vref.

A similar circuit may also be used to verify whether the clock signal CLK remains high, e.g., by applying an inverted version of the clock signal CLK to the inverter stage M1/M2.

Of course, without prejudice to the principle of the invention, the details of construction and the embodiments may vary widely with respect to what has been described and illustrated herein purely by way of example, without thereby departing from the scope of the present invention, as defined by the ensuing claims.

What is claimed is:

1. A processing system comprising:
   a timer circuit configured to generate, in response to a clock signal, a system time signal comprising a plurality of bits indicative of a time tick-count;
   a processing circuit configured to:
   receive the system time signal from the timer circuit, detect whether the system time signal reaches or exceeds a given reference value, and start execution of a given processing operation when the detection indicates that the system time signal has reached or has exceeded the given reference value;

an error code calculation circuit configured to compute a first set of error detection bits as a function of the plurality of bits of the system time signal transmitted to the processing circuit;

a first error detection circuit configured to:
compute a second set of error detection bits as a function of the plurality of bits of the system time signal received by the processing circuit,
compare the first set of error detection bits with the second set of error detection bits, and
generate a first error signal when the comparison indicates the first set of error detection bits does not correspond to the second set of error detection bits; and a second error detection circuit configured to:
compute a third set of error detection bits as a function of the plurality of bits of the system time signal transmitted to the processing circuit,
compare the first set of error detection bits with the third set of error detection bits, and
generate a second error signal when the comparison indicates that the first set of error detection bits does not correspond to the third set of error detection bits.

2. The processing system of claim 1, wherein:
a physical distance between the error code calculation circuit and the timer circuit is smaller than a physical distance between the error code calculation circuit and the processing circuit;
a physical distance between the first error detection circuit and the processing circuit is smaller than a physical distance between the first error detection circuit and the timer circuit; and
a physical distance between the second error detection circuit and the timer circuit is smaller than a physical distance between the second error detection circuit and the processing circuit.

3. The processing system of claim 1, wherein the first error detection circuit comprises two redundant error detection circuits.

4. The processing system of claim 1, wherein the error code calculation circuit is configured to compute the first set of error detection bits by using an error correction code, and wherein the first error detection circuit is configured to:
correct single bit errors of the system time signal; and
generate the first error signal when the system time signal has a double bit error.

5. The processing system of claim 1, wherein the timer circuit comprises:
a digital counter configured to generate a count value in response to the clock signal;
a digital comparator configured to generate a comparison signal by comparing the count value with a first reference value; and
an accumulator configured to increase the system time signal in response to the comparison signal.

6. The processing system of claim 1, wherein the processing circuit comprises:
a digital or analog processing circuit;
a further digital comparator configured to generate an interrupt signal for the digital or analog processing circuit by comparing the system time signal with a second reference value; and a programmable register configured to store the second reference value.

7. The processing system of claim 6, wherein the processing circuit further comprises:
an adder configured to increase the second reference value by a given amount in response to the interrupt signal.

8. The processing system of claim 1, further comprising:
a trigger generator configured to generate a trigger signal comprising a trigger when the system time signal increases by a given amount, and a watchdog timer configured to generate a third error signal when a time between two consecutive triggers in the trigger signal is greater than a given first maximum time; or
a further timer circuit configured to generate a fourth error signal when a time between two consecutive triggers in the trigger signal is not between a lower threshold and an upper threshold.

9. The processing system of claim 8, further comprising the trigger generator and the watchdog timer.

10. The processing system of claim 9, further comprising the further timer circuit.

11. The processing system of claim 8, wherein the watchdog timer or the further timer circuit operate in response to the clock signal, and wherein the processing system further comprises:
an analog clock monitor unit configured to generate a fifth error signal when the clock signal remains low or high for a given second maximum time.

12. The processing system of claim 1, wherein the processing system is implemented in an integrated circuit.

13. The processing system of claim 12, wherein the integrated circuit is a micro-controller.

14. The processing system of claim 1, wherein the system time signal comprises 32 or 64 bits.

15. A device comprising a plurality of processing systems, wherein each processing system of the plurality of processing systems comprises:
a timer circuit configured to generate, in response to a clock signal, a system time signal comprising a plurality of bits indicative of a time tick-count;
a processing circuit configured to:
receive the system time signal from the timer circuit,
detect whether the system time signal reaches or exceeds a given reference value, and
start execution of a given processing operation when the detection indicates that the system time signal has reached or has exceeded the given reference value;
an error code calculation circuit configured to compute a first set of error detection bits as a function of the plurality of bits of the system time signal transmitted to the processing circuit;
a first error detection circuit configured to:
compute a second set of error detection bits as a function of the plurality of bits of the system time signal received by the processing circuit,
compare the first set of error detection bits with the second set of error detection bits, and
generate a first error signal when the comparison indicates the first set of error detection bits does not correspond to the second set of error detection bits; and
a trigger generator configured to generate a trigger signal comprising a trigger when the system time signal increases by a given amount, and a watchdog timer configured to generate a third error signal when a time between two consecutive triggers in the trigger signal is greater than a given first maximum time, or a further timer circuit configured to generate a fourth error signal when a time between two consecutive triggers in the trigger signal is not between a lower threshold and an upper threshold.

16. The device of claim 15, wherein the device is a motor vehicle.

17. A method of operating a processing system, the method comprising:

generating via a timer circuit of the processing system a system time signal;

computing a first set of error detection bits as a function of bits of the system time signal using an error code calculation;

transmitting the system time signal and the first set of error detection bits to a processing circuit of the processing system;

computing a second set of error detection bits as a function of the bits of the system time signal received by the processing circuit of the processing system using a first error detection circuit;

comparing the first set of error detection bits with the second set of error detection bits, and when the comparison indicates that the first set of error detection bits does not correspond to the second set of error detection bits, generating a first error signal;

computing a third set of error detection bits as a function of the bits of the system time signal using a second error detection circuit;

comparing the first set of error detection bits with the third set of error detection bits;

generating a second error signal when the comparison indicates that the first set of error detection bits does not correspond to the third set of error detection bits; and detecting whether the system time signal reaches or exceeds a given reference value, and when the detection indicates that the system time signal has reached or has exceeded the given reference value, starting execution of a given processing operation of the processing circuit of the processing system.

18. The method of claim 17, further comprising:

correcting single bit errors of the system time signal; and generating the first error signal when the system time signal has a double bit error.

19. The method of claim 17, further comprising:

generating a trigger signal comprising a trigger when the system time signal increases by a given amount; and generating a third error signal when a time between two consecutive triggers in the trigger signal is greater than a given first maximum time.

20. The method of claim 17, further comprising providing the first or second error signals to an error collection circuit.

* * * * *